US007915981B2

(12) United States Patent
Snodgrass et al.

(10) Patent No.: US 7,915,981 B2
(45) Date of Patent: Mar. 29, 2011

(54) COAXIAL-TO-MICROSTRIP TRANSITIONS

(75) Inventors: David K Snodgrass, Groton, MA (US); Thomas M Gaudette, Cameron Park, CA (US); Mark V Faulkner, Napa, CA (US); Thomas G Flack, Union City, CA (US); Thomas E Halterman, Folsom, CA (US); Mario Pinamonti La Marche, Fremont, CA (US); Edward B Anderson, Portland, OR (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 12/788,328

(22) Filed: May 27, 2010

(65) Prior Publication Data

US 2010/0245001 A1 Sep. 30, 2010

Related U.S. Application Data

(62) Division of application No. 12/038,546, filed on Feb. 27, 2008, now Pat. No. 7,750,764.

(51) Int. Cl.
*H03H 7/38* (2006.01)

(52) U.S. Cl. .......................................... 333/260; 333/33

(58) Field of Classification Search .................. 333/260, 333/33

See application file for complete search history.

(56) References Cited

U.S. PATENT DOCUMENTS

| | | | |
|---|---|---|---|
| 2,983,884 | A | 5/1961 | Reuger |
| 4,611,186 | A | 9/1986 | Ziegner |
| 4,837,529 | A | 6/1989 | Gawronski et al. |
| 4,951,011 | A | 8/1990 | Heckaman et al. |
| 4,994,771 | A | 2/1991 | Takamine et al. |
| 5,123,863 | A | 6/1992 | Frederick et al. |
| 5,175,522 | A | 12/1992 | Clark et al. |
| 5,308,250 | A | 5/1994 | Walz |
| 5,402,088 | A | 3/1995 | Pierro et al. |
| 5,418,505 | A | 5/1995 | Agarwal et al. |
| 5,517,747 | A | 5/1996 | Pierro et al. |

(Continued)

FOREIGN PATENT DOCUMENTS

EP 0800225 A2 10/1997

(Continued)

OTHER PUBLICATIONS

Mattehw Morgan and Sander Weinreb, "A Millimeter-Wave Perpendicular Coax-To-Microstrip Transition", Microwave Symposium Digest, 2002 IEEE MTT-S International vol. 2, Issue 2002, pp. 817-820; IEEE Piscataway, New Jersey.

(Continued)

*Primary Examiner* — Stephen E Jones
(74) *Attorney, Agent, or Firm* — Simon Kahn

(57) ABSTRACT

Coaxial-to-microstrip transitions may include a microstrip line and coaxial-line assembly. The microstrip line includes a first dielectric having an aperture, a conductive strip disposed on one primary face of the first dielectric, and a ground plane disposed on the opposite primary face of the first dielectric. The coaxial-line assembly includes an outer conductor and an inner conductor. In some examples, the ground plane extends between the outer conductor and the inner conductor on a first side of the coaxial-line assembly proximate the conductive strip and an aperture cross section extends beyond the outer conductor on a second side of the coaxial-line assembly distal the conductive strip. In some examples, the ground plane has a non-circular aperture. In some examples, the outer conductor encloses an area that is less than an area of the aperture. In some examples, the enclosed area has a width that is less than a corresponding width of the first aperture.

22 Claims, 5 Drawing Sheets

U.S. PATENT DOCUMENTS

| | | | |
|---|---|---|---|
| 5,552,753 | A | 9/1996 | Agarwal et al. |
| 5,557,074 | A | 9/1996 | Miyamoto et al. |

FOREIGN PATENT DOCUMENTS

| | | | |
|---|---|---|---|
| EP | 0800225 | A3 | 10/1997 |
| JP | 55085104 | | 6/1980 |
| JP | 60000101 | | 1/1985 |
| JP | 2000232304 | | 8/2000 |

OTHER PUBLICATIONS

Anritsu Corporation, Product Catalog, “Precision RF & Microwave Components Catalog No. 11410-00235 Rev. F”, printed Nov. 2006. Submission comprises the front cover, catalog pp. 1-19 and the back cover (21 pages total).

International Search Report for parallel application PCT/US2009/034962 issued Apr. 15, 2009 by European Patent Office.

Written Opinion for the International Searching Authority for parallel application PCT/US2009/034962 issued Apr. 15, 2009 by European Patent Office.

J. Roh et al.; Novel Approach to Optimizing a Broadband Right-Angle Coaxial-to-Microstrip Transition; Microwave and Optical Technology Letters, vol. 49, No. 2, pp. 451-455, Feb. 2007, Wiley Interscience, Hoboken, New Jersey.

S.A. Wartenberg; A Coaxial-to-Microstrip Transition for Multilayer Substrates; IEEE Transactions on Microwave Theory and Techniques, vol. 52, No. 2, pp. 585-588, Feb. 2004, IEEE Piscataway, New Jersey.

COAXIAL-TO-MICROSTRIP TRANSITIONS

BACKGROUND

Coaxial-to-microstrip transitions find application in microwave and high-frequency systems. Generally, coaxial-to-microstrip transitions are structures that provide a transition between a coaxial line and a microstrip line. Transitions between coaxial lines and microstrip lines can be "inline" or angled. Inline transitions occur along a common axis, and angled transitions occur along disparate axes, such as at a bend or a right-angle turn.

Angled portions of high-frequency transmission lines, such as angled transitions, can be a source of impedance discontinuity that degrades signal transmission. Impedance discontinuities degrade signal transmission by causing energy to reflect back toward the energy source and radiate away from the transmission line, which reduces the input energy reaching the intended destination. Parasitic inductance is a cause of impedance discontinuity in angled portions of transmission lines. Parasitic inductance generally includes both signal conduction path inductance and ground path inductance.

The following U.S. patents provide examples of devices and methods relevant to coaxial-to-microstrip transitions, and they are expressly incorporated herein by reference for all purposes:

U.S. Pat. Nos. 2,983,884, 5,557,074, 4,611,186, 4,837,529, 4,951,011, 4,994,771, 5,123,863, 5,175,522, 5,308,250, 5,402,088, 5,418,505, 5,517,747, and 5,552,753.

A further example of devices and methods relevant to coaxial-to-microstrip transitions is found in Morgan and Weinreb "A millimeter-wave perpendicular coax-to-microstrip transition," *Microwave Symposium Digest,* 2002 *IEEE MTT-S International*, Vol. 2, pp. 817-820, June 2002, which is expressly incorporated herein by reference for all purposes.

SUMMARY

Coaxial-to-microstrip transitions may include a microstrip line and a coaxial-line assembly. The microstrip line may include a first substrate dielectric, a conductive strip on one face of the dielectric, and a ground plane disposed on a second face of the dielectric opposite the first face. The coaxial-line assembly, extending transverse to the microstrip ground plane, may include an outer conductor and an inner conductor. In some examples, the ground plane contacts an end of the outer conductor and extends between the outer conductor and the inner conductor on a side of the coaxial-line assembly proximate the conductive strip. In some examples, the inner conductor extends through an aperture in the ground plane. The aperture may extend beyond the outer conductor on a second side of the coaxial-line assembly opposite the first side. In some examples, the ground plane has a non-circular aperture. In some examples, a cross-sectional area bound by the outer conductor is less than a corresponding cross-sectional area of the aperture. In some examples, the cross-sectional area bound by the outer conductor has a width that is less than a first-aperture width.

DETAILED DESCRIPTION

Figure 1:
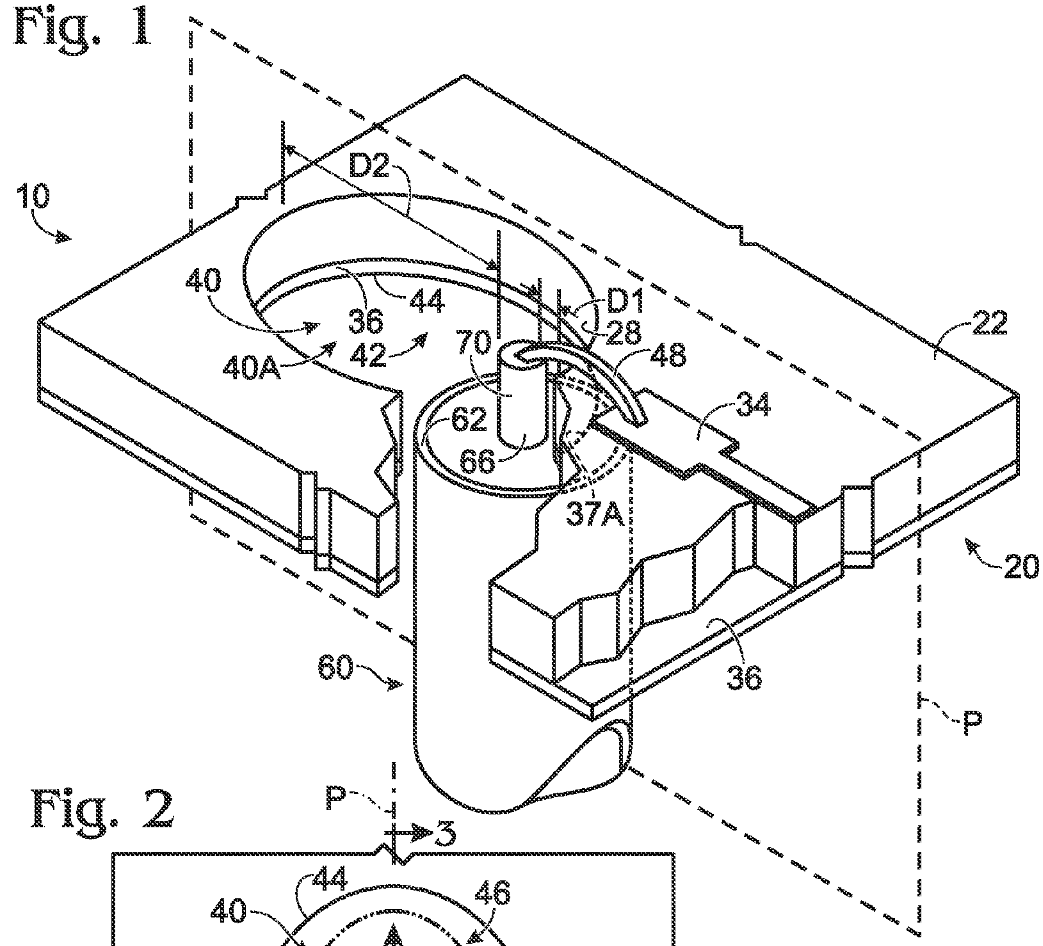
FIG. 1 is a perspective view of a coaxial-to-microstrip transition including a microstrip line and a coaxial-line assembly.

Coaxial-to-microstrip transitions and manufacturing methods disclosed in the present disclosure will become better understood through review of the following detailed description in conjunction with the drawings and the claims. The detailed description, drawings, and claims provide merely examples of the various inventions described herein. Those skilled in the art will understand that the disclosed examples may be varied, modified, and altered without departing from the scope of the inventions as defined in the claims, and all equivalents to which they are entitled. Many variations are contemplated for different applications and design considerations; however, for the sake of brevity, each and every contemplated variation is not individually described in the following detailed description.

As shown in FIGS. 1-7, a coaxial-to-microstrip transition 10 may include a microstrip line 20 and a coaxial-line assembly 60. Coaxial-to-microstrip transition 10 may function to transition radio frequency (RF) signals, such as microwave or millimeter wave signals, between coaxial-line assembly 60 and microstrip line 20.

Microstrip line 20 may be oriented in various positions relative to coaxial-line assembly 60. For example, as shown in FIGS. 1-7, coaxial-to-microstrip transition 10 may have a central or inner conductor 66 of coaxial-line assembly 60 that is oriented at a transverse angle relative to a plane P of microstrip line 20 (shown in FIGS. 1 and 2). In other examples, coaxial-to-microstrip transition 10 may generally be coplanar, having a coaxial inner conductor that is oriented generally inline with microstrip line 20. The following examples have transverse angled transitions, and more particularly transitions forming a 90-degree angle.

As shown in FIGS. 1-4, microstrip line 20 may include a dielectric substrate, referred to as a first dielectric 22 interposed between a conductive signal strip 34 and a return-signal ground plane 36. Any material, gas, composition, or element known in the art to be suitable as a dielectric may be used. For example, semiconductors, plastics, porcelains, ceramics, glasses, or gasses, such as air, nitrogen, or sulfur hexafluoride may be suitable for use as first dielectric 22 in certain applications.

Figure 2:
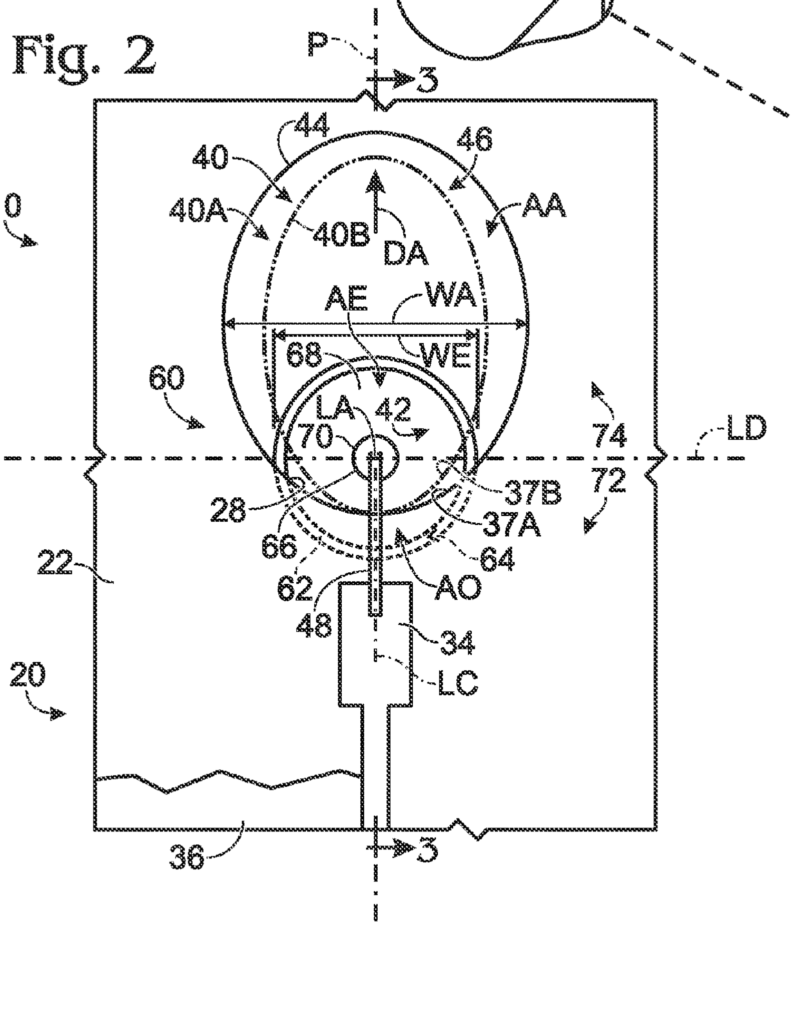
FIG. 2 is a top view of the coaxial-to-microstrip transition of FIG. 1.
Figure 3:
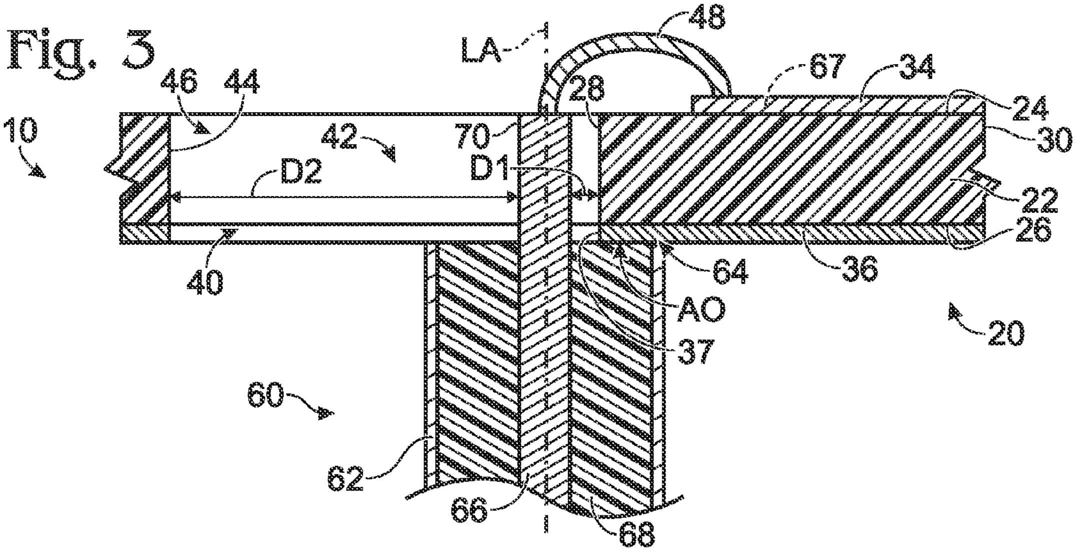
FIG. 3 is a side cross-sectional view of the coaxial-to-microstrip transition of FIG. 1 taken along the line 3-3 in FIG. 2.
Figure 4:
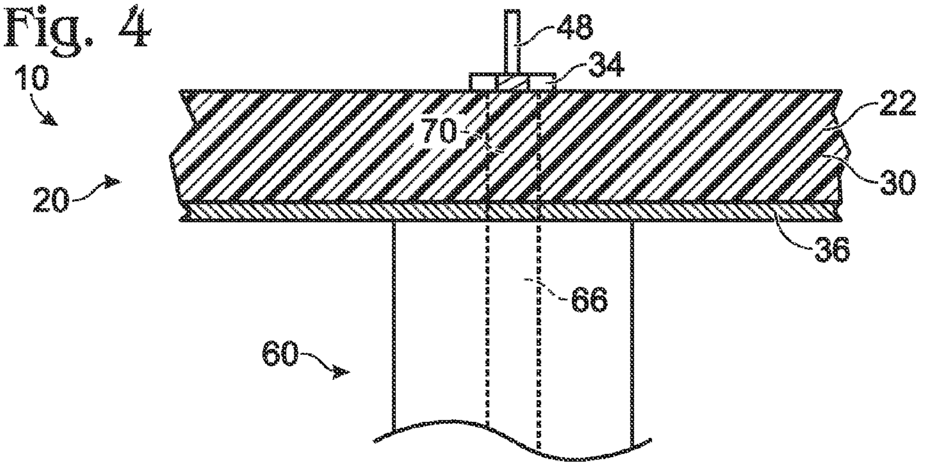
FIG. 4 is a side view of the coaxial-to-microstrip transition of FIG. 1 taken from a side of the coaxial-line assembly opposite the microstrip.
Figure 5:
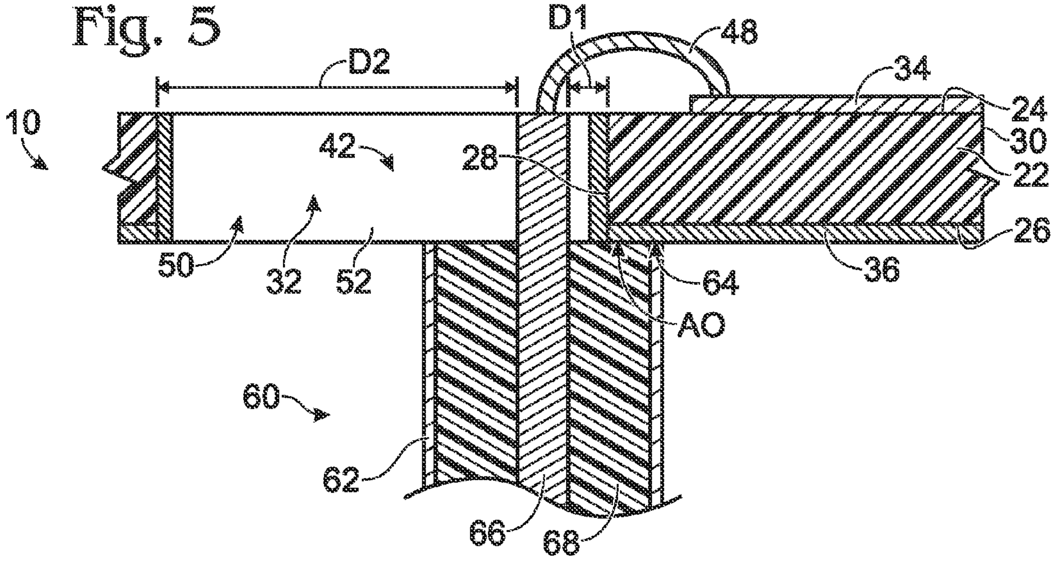
FIG. 5 is a cross-sectional view of a coaxial-to-microstrip transition including an aperture in a dielectric plated with a conductive material to form a via.
Figure 7:
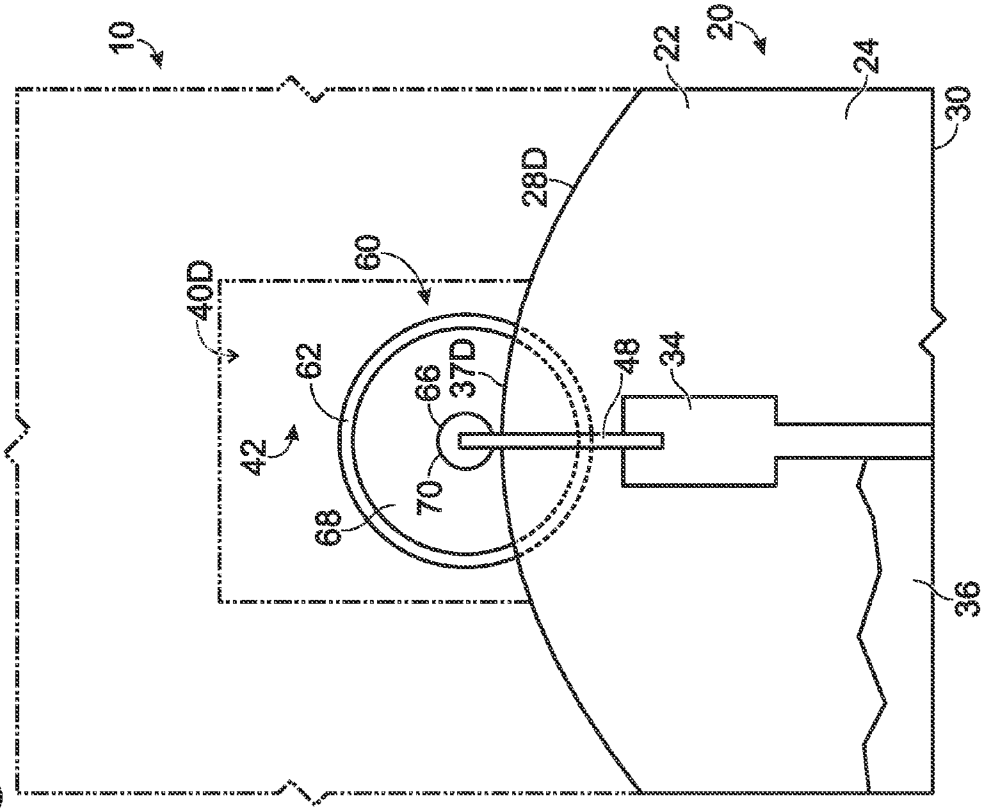
FIG. 7 is a top view of a coaxial-to-microstrip transition including a ground plane having an edge facing the inner conductor that forms a convex curve relative to the inner conductor.
Figure 6:
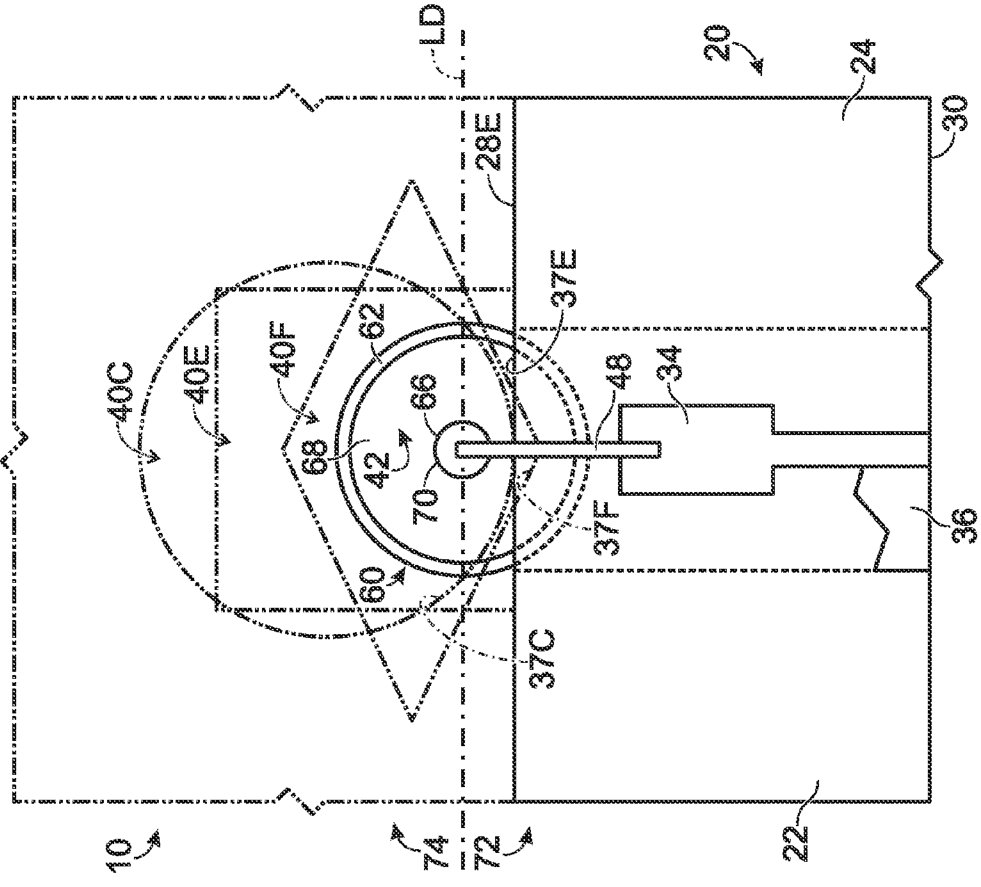
FIG. 6 is a top view of a coaxial-to-microstrip transition including a ground plane having a straight interface edge.
Figure 13:
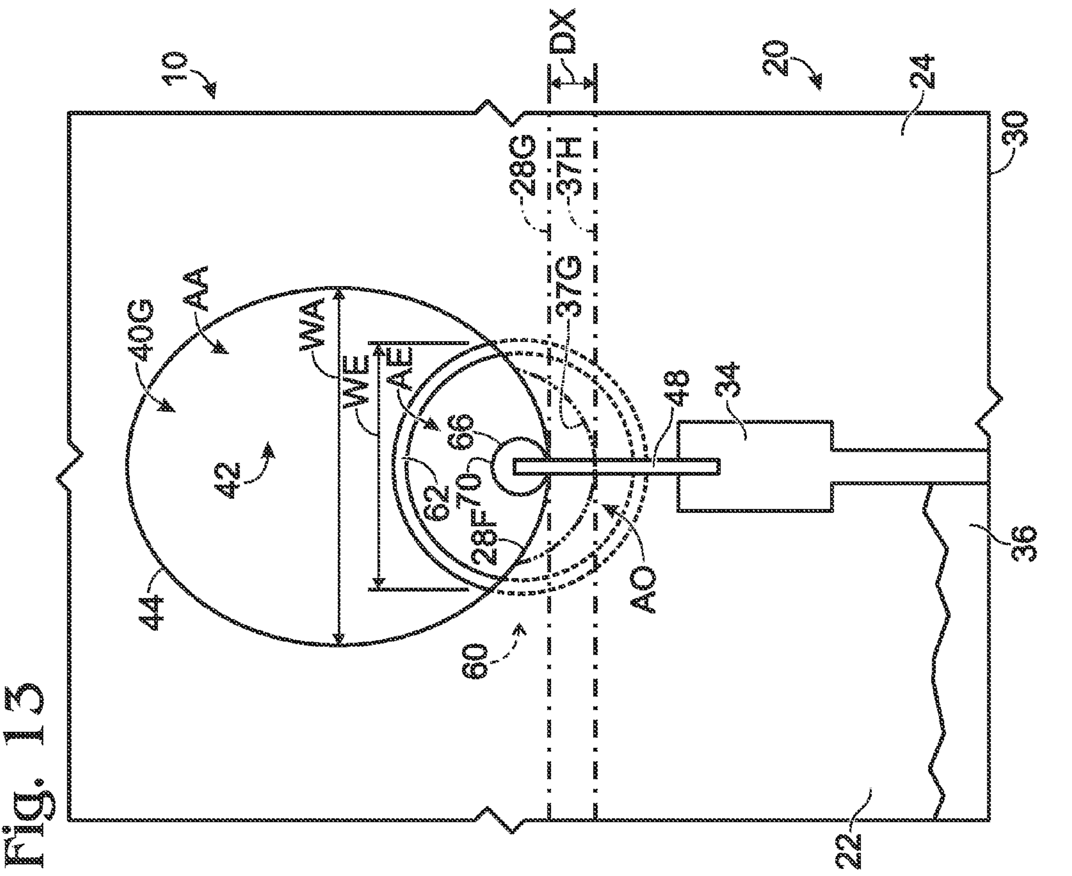
FIG. 13 is a top view of a further embodiment of a coaxial-to-microstrip transition.

In the examples shown in FIGS. 1-7, first dielectric 22 is a substrate having a first primary face 24 and a second primary face 26 opposite first primary face 24. Additionally or alternatively, first dielectric 22 may include a leading-edge face 28 extending between first and second primary faces 24, 26 that is proximate coaxial-line assembly 60. FIGS. 1, 2, and 13 show leading-edge face 28 being curved and concave relative to coaxial-line assembly 60. A leading-edge face 28D that is curved and convex relative to coaxial-line assembly 60 is shown in FIG. 7. A leading edge face 28E that is planar and parallel to line LD is shown in FIG. 6. As will be seen in some examples, a trailing-edge face 30 is disposed opposite leading-edge face 28, as is shown in FIGS. 3, 4 and 5.

Conductive strip 34 may be disposed on, supported by, secured to, or printed on first primary face 24 of first dielectric 22. In the example shown in FIGS. 1-4, conductive strip 34 is formed from a relatively thin conductive material and secured to first primary face 24. As is known in the art, conductive strip 34 generally functions to propagate a signal along its length. The signal may follow an inner conduction path 67 illustrated in FIG. 3. In the examples shown in FIGS. 1-7, a bond wire 48 electrically connects conductive strip 34 with an end of inner conductor 66 of coaxial-line assembly 60. A relatively short bond wire may provide reduced parasitics for transition 10. As is known in the art, conductive strip 34 may vary in width to provide impedance transformation at the transition and to facilitate construction.

In the example shown in FIGS. 1, 3, 4, and 5, ground plane 36 is a conductive layer disposed on all or a portion of second primary face 26 of first dielectric 22 opposite conductive strip 34. Ground plane 36 provides a signal-return path. Ground plane 36 is directly or indirectly electrically connected to an outer conductor 62 of coaxial-line assembly 60, such as by being directly connected to outer conductor 62. Ground plane 36 may be formed of any suitable material.

A variety of ground plane 36 configurations are contemplated. For example, an interface edge 37 of ground plane 36 proximate coaxial-line assembly 60 may embody a variety of geometries. Examples of different interface edges 37A-H are shown in FIGS. 1, 2, 6, 7, and 13 and described more particularly below. The geometry of interface edge 37 may have attendant electrical effects on the transition between the microstrip line and the coaxial line. Indeed, geometries of interface edge 37 may affect series inductances and shunt capacitances existing within coaxial-to-microstrip transition 10.

As shown in FIG. 1, the interface edge 37A may be curved. Different degrees of curvature are contemplated. Optional curved interface edges are shown as interface edge 37A in FIG. 1 and FIG. 2, interface edge 37B in FIG. 2, interface edge 37C in FIG. 6, interface edge 37D in FIG. 7, and interface edge 37G in FIG. 13. The curved interface edges 37A, 37B, 37C, and 37G shown in FIGS. 1, 2, 6, and 13 are concave relative to coaxial-line assembly 60. In contrast, the curved interface edge 37D shown in FIG. 7 is convex relative to coaxial-line assembly 60.

In some examples, interface edge 37 of ground plane 36 is straight or a series of straight edges forming angles. For example, in FIG. 6, the interface edge 37E is straight, and interface edge 37F is a series of straight edges forming an angle. In the example shown in FIG. 6, angular interface edge 37F is concave relative to the coaxial-line assembly 60. However, in other examples, angular interface edges are convex relative to coaxial-line assembly 60.

Interface edge 37 of ground plane 36 may define a portion of a peripheral edge 44 of a first aperture 40 extending through ground plane 36. As shown in FIGS. 1-3, 5-7, and 9-12, aperture 40 may receive at least a portion of coaxial-line assembly 60, such as an extension portion 70 of an inner conductor 66. As shown in FIGS. 6 and 7, however, in some examples coaxial-to-microstrip transitions 10 do not include apertures through ground plane 36. Rather, interface edge 37 facing the inner conductor is an outer edge of the ground plane.

FIG. 2 shows a top view of transition 10, and FIG. 3 shows a cross section taken along line 3-3 in FIG. 2. It is seen in these figures that inner conductor 66 extends through aperture 40 along an axis LA. As further shown in FIG. 2, when viewing ground plane 36 from a plane spaced along axis LA, aperture 40 may have an aperture area AA in the ground plane. With further reference to FIG. 2, aperture area AA may have a width WA. Aperture-area width WA is the widest dimension of the first aperture along a line parallel to line LD. Line LD is a line orthogonal to a line LC extending between the end of inner conductor 66 and the point where bond wire 48 is attached to the microstrip conductor 34.

Those skilled in the art will appreciate that different geometries of aperture 40 may produce different electrical field distributions. FIGS. 1, 6, 7, and 13 depict a sampling of the variety of shapes that aperture 40 may have. For example, in FIG. 2, apertures 40A and 40B have oval shapes. In FIG. 6, first aperture 40C has a circular shape, aperture 40E has a rectangular shape, and aperture 40F has a diamond shape. In FIG. 7, aperture 40D has an irregular shape with straight and curved edge portions. In FIG. 13, aperture 40G has an oval shape.

In some examples, such as those shown in FIGS. 1-7 and 13, first dielectric 22 includes a second aperture 46 extending at least partially through its thickness. Second aperture 46 may at least partially conform to and align with first aperture 40. For example, they may have substantially the same shape and be co-incident when viewed in the view of FIG. 2. However, in alternative examples second aperture 46 does not conform to first aperture 40. First aperture 40 and second aperture 46 may separately or collectively define an unobstructed region 42. Unobstructed region 42 may receive components of coaxial-to-microstrip transition 10. For example, as shown in FIGS. 1, 3, 4, and 5, portions of coaxial-line assembly 60, such as inner conductor 66, may extend into unobstructed region 42.

First aperture 40 and/or second aperture 46 may or may not be lined with a conductive material 52 to form a conductive via 50. As is known in the art, a via may be an aperture plated or otherwise lined with a conductive material, such as a metal or alloy, to facilitate conduction of electrical currents between conductors on the respective primary faces of the substrate dielectric. Inner conductor 66 may extend through via 50 in spaced relationship from inner liner material 52. In the example shown in FIGS. 1-4, second aperture 46 is not lined with conductive material 52. In the example shown in FIG. 5, inner conductor 66 is asymmetrically received within via 50. As discussed further below, asymmetrical positioning of inner conductor 66 within via 50 may cause an electric field to concentrate in a particular manner based on the proximity of conductive material 52 to inner conductor 66. Optionally, second aperture 46 for any of the examples in FIGS. 1-7 may be lined with conductive material 52.

In some examples, a second dielectric 32 is provided within first aperture 40. Additionally or alternatively, second dielectric 32, or another dielectric, may be disposed within second aperture 46. Second dielectric 32 may be the same or different from first dielectric 22. As with first dielectric 22, second dielectric 32 may be any material, gas, composition, or element known in the art to be suitable for use as a dielectric. For example, plastics, porcelains, glasses, semiconductors, resins, or gasses, such as air, nitrogen, or sulfur hexafluoride may be suitable for use as second dielectric 32 in certain applications. In some examples, first dielectric 22 may be a solid substrate made of one type of dielectric and second dielectric 32 may be air or may be a solid substrate made of another type of dielectric.

Coaxial-line assembly 60 may include outer conductor 62 shielding at least a portion of inner conductor 66 and extending along common axis LA with inner conductor 66. A third dielectric (or insulator) 68 may separate outer conductor 62 from inner conductor 66. As indicated in FIG. 2, coaxial-line assembly 60 may be described as having two sides on either side of a dividing line LD. A first side 72 shown in FIG. 2, may be defined as being proximate (on the same side of line LD as) conductive strip 34. A second side 74, shown in FIG. 2, may be defined as being distal (on the opposite side of line LD as) conductive strip 34.

A variety of configurations of coaxial-line assembly 60 are contemplated. In some examples, such as those shown in FIGS. 1-7 and 13, coaxial-line assembly 60 includes a coaxial cable configuration in which inner conductor 66 is radially surrounded by third dielectric 68 and outer conductor 62. In a coaxial cable configuration, outer conductor 62 typically forms a concentric sheath around inner conductor 66. In some examples, coaxial-line assembly 60 may include a coaxial cable portion and a connector portion physically and electrically coupled to the cable portion. Many connector portions suitable for use with coaxial cables are known in the art, including K flange launchers, threaded “sparkplug” launchers, C (Councelman) connectors, GR (general radio) connectors, N (Neill) connectors, glass beads, and the like.

In a variety of ways and with a variety of components, connector portions generally provide an inner conduction path separated by a dielectric from a surrounding coaxial outer conduction path. Inner conductor 66 thus may be a single component or collection of connected components that collectively forms the inner conduction path. Similarly, outer conductor 62 may be a single component or collection of components that collectively provides the outer conduction path.

Outer conductor 62 may be electrically connected to ground plane 36 to provide a signal return path continuing between coaxial-line assembly 60 and microstrip line 20. In some examples, such as those shown in FIGS. 1-7 and 13 at least a portion 64 (shown in dashed lines in FIG. 2) of outer conductor 62 is in physical contact with ground plane 36. Additionally or alternatively, an electrical connection device, such as solder, connector, conductors, or other circuit components, may electrically connect outer conductor 62 with ground plane 36.

As shown in FIG. 2, when viewing the transition end of coaxial-line assembly 60 from a plane parallel to and spaced from ground plane 36 along axis LA, it can be seen that outer conductor 62 may surround an enclosed area AE. Enclosed area AE is the area enclosed by outer conductor 62 when viewed in a plane parallel to ground plane 36 where outer conductor 62 contacts at least a portion of ground plane 36. With further reference to FIG. 2, enclosed area AE may have a width WE. Enclosed-area width WE may be defined to be the length along line LD. WE also corresponds to the diameter of an outer conductor having a circular cross section.

As shown in FIGS. 1-4, extension portion 70 of inner conductor 66 may extend along axis LA beyond outer conductor 62. Extension portion 70 may be positioned proximate to microstrip line 20, for example, proximate to conductive strip 34 and/or ground plane 36. Extension portion 70 is electrically connected to conductive strip 34 either directly or indirectly, such as via bond wire 48, solder, or other connector. In the examples shown in FIGS. 1-5, extension portion 70 extends into first aperture 40 of ground plane 36 and into second aperture 46 of first dielectric 22.

During use of transition 10, an electrical field may exist between extension portion 70 and ground plane 36 in examples where extension portion 70 is adjacent to ground plane 36 or extends into first aperture 40 of ground plane 36. Of relevance, the electrical field may tend to concentrate towards portions of ground plane 36 in relatively close proximity to extension portion 70. In some examples, such as those shown in FIGS. 1, 2, 3, 5, 6, and 7, interface edge 37 of the ground plane is in relatively close proximity to extension portion 70. In some applications, concentrating the electric field in certain positions may provide certain utility, such as affecting ground-path series inductances and shunt capacitances that may be present.

In the examples shown in FIGS. 1-7 and 13, extension portion 70 and interface edge 37 or conducting material 52 of via 50 are placed in relatively close proximity to conductive strip 34 on first side 72 of the coaxial line. The proximity of extension portion 70 relative to interface edge 37 may be selected to produce desired electrical properties, such as series inductance along and shunt capacitance between the signal and signal-return conductors. In the examples shown in FIGS. 1-7 and 13, the electrical field tends to concentrate toward the conductive strip side of coaxial-to-microstrip transition 10. Concentrating the electrical field toward the conductive strip side of coaxial-to-microstrip transition 10 may reduce the inductance occurring in the transition.

One source of ground-path inductance can be due to a portion of the electrical field occurring between inner conductor 66 and a second side 74 of coaxial-line assembly 60 opposite conductive strip 34. In general, a portion of the electrical field may extend between extension portion 70 and portions of either ground plane 36 or outer conductor 62 on second side 74. This field produces return currents that travel through long ground paths to reach the microstrip ground. The portion of the electrical field occurring on second side 74 is reduced when the electrical field is concentrated on first side 72, thereby reducing ground-path inductance.

As is seen in the figures, coaxial-to-microstrip transitions 10 may have a variety of configurations. Different orientations, geometries, and proximities of components in coaxial-to-microstrip transitions 10 may produce different electrical properties in the transitions, and may have different costs to produce.

In the example shown in FIGS. 1-4, ground plane 36 extends between outer conductor 62 and inner conductor 66 on first side 72 of coaxial-line assembly 60. In this context, ground plane 36 may be referred to as overlapping a portion of enclosed area AE. The portion of enclosed area AE overlapped by ground plane 36 may be referred to as an overlap area or portion AO, which is shown in FIGS. 2 and 13.

As can be seen in the example shown in FIG. 2, overlap portion AO is located substantially on first side 72 of dividing line LD. In other examples, a small fraction of overlap portion AO may be located on second side 74 of dividing line LD. For example, a small fraction of overlap portion AO may be located on second side 74 in first aperture 40B in FIG. 2 and first aperture 40C in FIG. 6. Most of overlap portion AO—for example, over 75%—may be located on first side 72. For example, having over 85% of the overlap on first side 72 provides increased concentration of electric fields between the ground plane and the inner conductor on first side 72. In some examples, overlap portion AO may be located entirely on first side 72, thereby attracting essentially all of the electric field on side 72 of the inner conductor. As further shown in FIG. 2, enclosed area AE may be less than aperture area AA and enclosed-area width WE may be less than aperture width WA, as shown.

In the example shown in FIGS. 1-4, ground plane 36 physically contacts outer conductor 62 along ground-plane portion 64 shown in FIGS. 2 and 3. As discussed above, outer conductor 62 may include more than the outer conductor of a standard coaxial cable or a coaxial cable connector. Indeed, outer conductor 62 may include a collection of components that provides an outer conduction path for a coaxial cable assembly.

As shown in FIGS. 1-3, 5-7, and 13 extension portion 70 of inner conductor 66 may be asymmetrically disposed in first aperture 40 as viewed in FIG. 2. In the example shown in FIG. 3, extension portion 70 is spaced a first distance D1 from interface edge 37 and spaced a second distance D2 from peripheral edge 44 opposite interface edge 37. A variety of D1/D2 ratios may be used in coaxial-to-microstrip transition 10. For example, ratios less than one, greater than one, or equal to one may be suitable in different applications. In the example shown in FIG. 3, the D1/D2 ratio is less than one. Generally, neither D1 nor D2 should equal zero as an electrical short between inner conductor 66 and ground may result.

Distances D1 and D2 may be distances between inner conductor 66 and conductive materials 52 of a via 50 in some examples. For instance, in the example shown in FIG. 5, extension portion 70 is spaced a first distance D1 from conductive material 52 of via 50 on first side 72 and spaced a second distance D2 from conductive material 52 on second side 74. As discussed above, D1/D2 ratios less than one, greater than one, or equal to one may be suitable in different applications.

As shown in FIG. 13, extension portion 70 may be disposed asymmetrically within first aperture 40G such that extension portion 70 abuts first dielectric 22. In one example shown in FIG. 13, interface edge 37G of ground plane 36 is offset from leading-edge face 28F of first dielectric 22 by a distance DX. As alternatively shown in FIG. 13, first dielectric 22 and ground plane 36 may be disposed only on one side of extension portion 70. In the alternative example shown in FIG. 13, extension portion 70 abuts leading edge face 28G, which is offset from interface edge 37H by distance DX. The offset distance DX between the leading edge face of first dielectric 22 and the interface edge of ground plane 36 may facilitate orienting extension portion 70 into a given position relative to microstrip line 20.

In the example shown in FIGS. 1-4, aperture area AA of first aperture 40 extends beyond outer conductor 62 on second side 74 of coaxial-line assembly 60 in a direction DA normal to axis LA. The position of the periphery of first aperture 40 beyond outer conductor 62, as shown in this example, may cause an electrical field to concentrate on first side 72. In other examples, first aperture 40 may extend short of or substantially to outer conductor 62 in direction DA on second side 74. The example shown in FIGS. 1-4 includes second aperture 46 conforming to first aperture 40, although, conformance of the apertures is not required. Air or another dielectric material may be disposed within second aperture 46 as a second dielectric 32 (indicated in FIG. 5, but not in FIG. 3), shown generally in FIG. 3.

As shown in FIGS. 1 and 6, coaxial-to-microstrip transitions 10 may include a ground plane having an aperture having a non-circular cross section. For example, each of apertures 40A, 40B, 40D, 40E, 40F, and 40G shown in FIGS. 1, 6, and 13 have non-circular cross sections. The shapes of the cross sections 40A, 40B, 40D, 40E, 40F, and 40G in FIGS. 1, 6 and 13 may be described as an oval, a narrower oval, irregular, rectangular, diamond, and a wider oval, respectively. By way of comparison, the aperture 40C shown in FIG. 6 has a circular cross section.

In some examples, the second aperture 46 extending through first dielectric 22 may also be non-circular in cross section. Extension portion 70 may be disposed symmetrically (not pictured) or asymmetrically (shown in FIGS. 1, 6, and 13) within aperture 46, as was discussed regarding aperture 40.

Methods of manufacturing coaxial-to-microstrip transitions 10 are also contemplated. In some examples, a method 100 may start with at least partially preassembled coaxial-line assemblies and/or microstrip lines. In other examples, method 100 may start with producing coaxial-line assemblies and/or microstrip lines. For instance, a general method 100 is shown as a flow chart in FIG. 8, which contemplates starting with a step 101 of providing a coaxial-line assembly 60 and a microstrip line 20, such as has been described.

Method 100 may include in a step 102 positioning the microstrip line in an orientation relative to the coaxial-line assembly. The orientation in which microstrip line 20 is positioned may be one in which ground plane 36 is transverse to the common axis LA of coaxial-line assembly 60. Transverse is defined to mean any orientation other than inline or parallel. In this example, ground plane 36 is oriented at substantially 90 degrees relative to the common axis LA, as shown in FIG. 9.

With the microstrip in this orientation, dielectric substrate 22 is spaced from extension portion 70 of inner conductor 66 and inner conductor 66 is aligned with apertures 40 and 46. In this example, ground plane 36 is proximate outer conductor 62.

Figure 9:
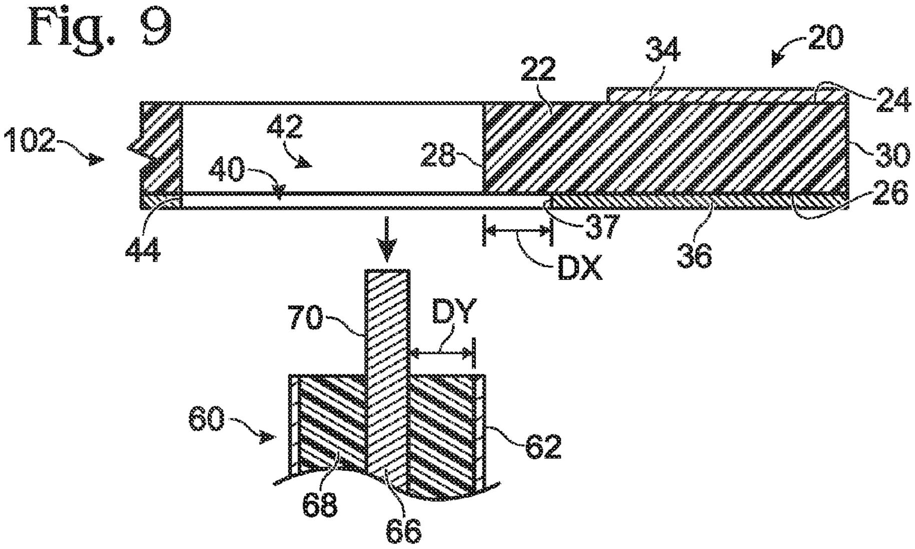
FIG. 9 is a structural illustration of positioning a microstrip line according to the method of FIG. 8.

In examples where ground plane 36 and/or dielectric substrate 22 includes an aperture 40 or aperture 46, step 102 of positioning the microstrip line may include positioning extension portion 70 within apertures 40 and 46, as represented by movement of the microstrip line from a position spaced from the coaxial-line assembly, as shown in FIG. 9, to a position in which the inner conductor extends into apertures 40 and 46. This step is considered equivalent to moving coaxial-line assembly 60 toward microstrip line 20—i.e., one component moves relative to the other, regardless of which if any are moved relative to an external reference.

Figure 8:
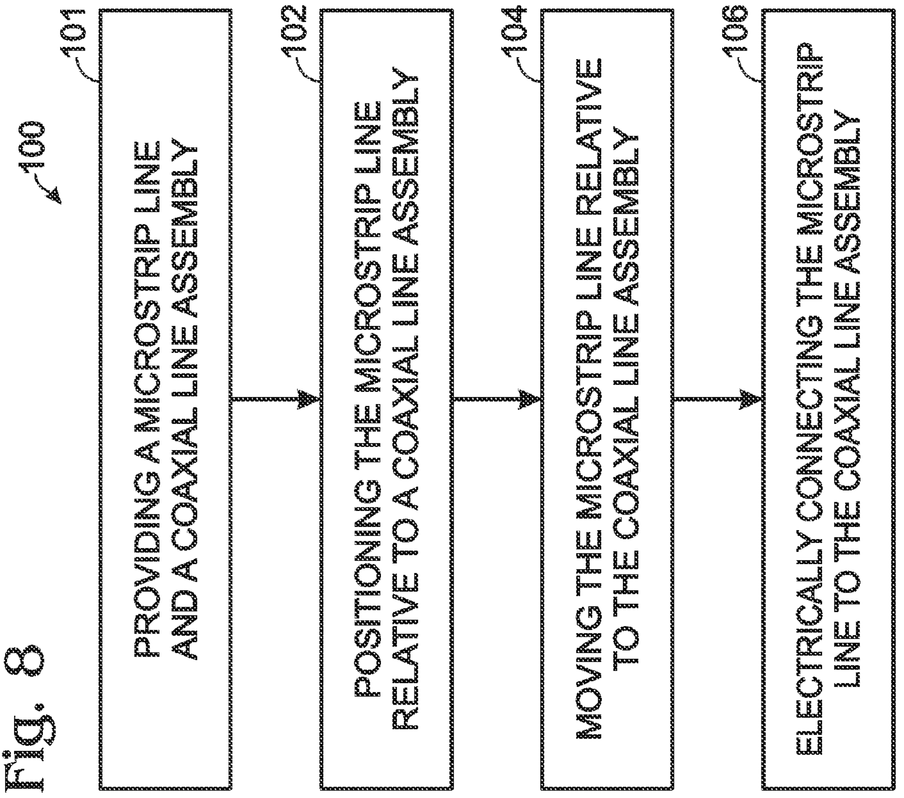
FIG. 8 is a flow chart of a method of manufacturing a coaxial-to-microstrip transition.
Figure 10:
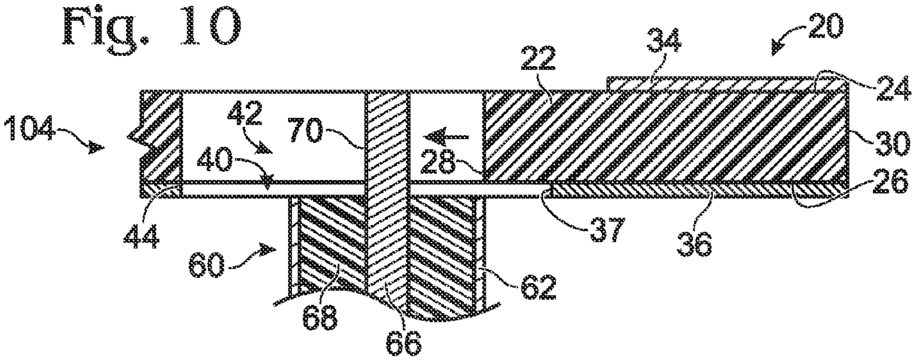
FIG. 10 is a structural illustration of moving a microstrip line according to the method of FIG. 8.
Figure 11:
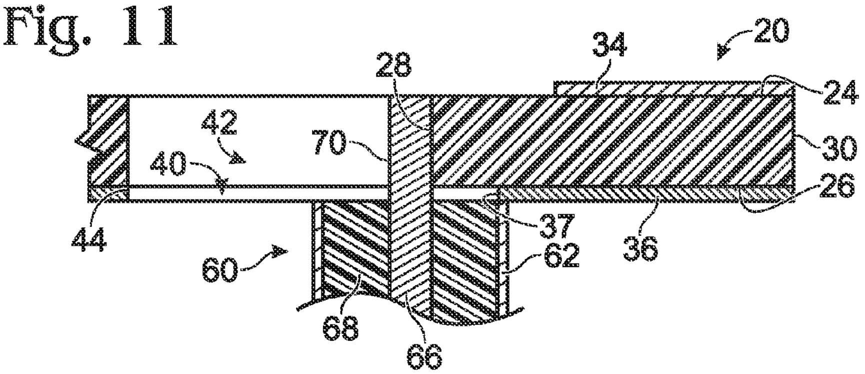
FIG. 11 is a structural illustration of a dielectric substrate of a microstrip line abutting a center conductor of a coaxial-line assembly according to the method of FIG. 8.

As described in FIG. 8 and illustrated in FIG. 10, method 100 may include a step 104 of moving leading-edge face 28 of first dielectric 22 toward extension portion 70 until the leading-edge face 28 abuts the extension portion In some examples, such as shown in the combination of FIGS. 10 and 11, moving the microstrip line 104 may include moving microstrip line 20 toward extension portion 70 until the ground plane 36 contacts outer conductor 62. Positioning step 102 and moving step 104 may be performed in reverse sequence or as a single step resulting in the positioning of the leading-edge face 28 against extension portion 70 with ground plane 36 in contact with outer conductor 62.

In certain examples, method 100 may include a step of selecting the microstrip line to be positioned and moved based on a desired final spatial relationship of the microstrip line and the coaxial-line assembly. For example, a desired relationship may be between a first distance DX and a second distance DY shown in FIG. 9. The first distance DX may be the distance between interface edge 37 of the ground plane 36 and leading-edge face 28 of dielectric substrate 22. In other words, in this example, interface edge 37 is recessed from leading-edge face 28 by dimension DX. The second distance DY may be the distance between inner conductor 66 and outer conductor 62 (the radial thickness of third dielectric 68). In some examples, the desired relationship is that first distance DX is substantially equal to second distance DY. In other examples, the desired relationship is that the first distance is less than the second distance. By contacting the inner conductor with the leading-edge face of the substrate dielectric, the distance DX between the inner conductor and the interface edge of the ground plane is established to the manufacturing tolerances of these components. This configuration reduces variations in the electrical performance of transition 10 due to varying distances DX during assembly.

Figure 12:
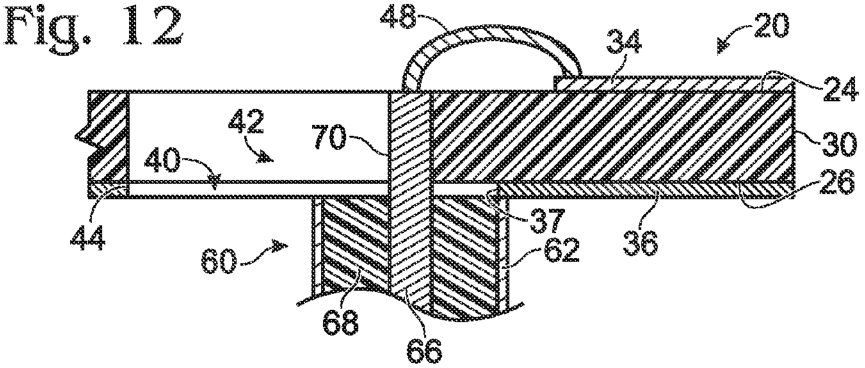
FIG. 12 is a structural illustration of electrically connecting a conductive strip with a center conductor according to the method of FIG. 8.

As described in FIG. 8 and illustrated in FIG. 12, method 100 may include a step 106 electrically connecting inner conductor 66 with the conductive strip 34. The electrical connection may be accomplished with bond wire 48 or by any other device for making an electrical connection known in the art.

As can be seen from the above description, a coaxial-to-microstrip transition may include a microstrip line including a first dielectric having a first primary face and a second primary face opposite the first primary face, a conductive strip disposed on the first primary face of the first dielectric, and a ground plane disposed on the second primary face of the first dielectric, and a coaxial-line assembly extending along an axis transverse to the ground plane and having an end adjacent to the microstrip line, the coaxial-line assembly including an outer conductor extending along the axis to the ground plane, an end of the outer conductor being in contact with the ground plane, and an inner conductor extending along the axis past the ground plane and being electrically connected to the conductive strip, wherein the ground plane extends to a position between the outer conductor and the inner conductor on only a first side of the coaxial-line assembly proximate the conductive strip.

It can also be seen from the above description that a coaxial-to-microstrip transition may include a microstrip line including a first dielectric having a first primary face and a second primary face opposite the first primary face, a ground plane disposed on the second primary face of the first dielectric, a conductive strip disposed on the first primary face of the first dielectric, a first aperture extending through the ground plane and having a non-circular cross section in a plane of the ground plane, and a coaxial-line assembly extending along an axis transverse to the ground plane and being adjacent the microstrip line, the coaxial-line assembly including an outer conductor extending along the axis to the ground plane, the outer conductor being in contact with the ground plane, and an inner conductor extending along the axis into the first aperture and being electrically connected to the conductive strip.

Moreover, the above description discloses that a coaxial-to-microstrip transition may include a microstrip line including a first dielectric having a first primary face and a second primary face opposite the first primary face, a conductive strip disposed on the first primary face of the first dielectric, a ground plane disposed on the second primary face of the first dielectric, and a first aperture extending through the ground plane and having a cross section defining an aperture area, and a coaxial-line assembly extending along an axis transverse to the ground plane and being adjacent the microstrip line, the coaxial-line assembly including an outer conductor in contact with the ground plane and having a cross section, in a plane parallel and proximate to the ground plane, defining an enclosed area, the ground plane overlapping a portion of the enclosed area on a first side of the coaxial-line assembly proximate the conductive strip and the first aperture extending beyond the outer conductor on a second side of the coaxial-line assembly opposite the first side, and an inner conductor extending along the axis into the first aperture and being electrically connected to the conductive strip.

It can be further seen from the above description that a coaxial-to-microstrip transition may include a microstrip line including a first dielectric having a first primary face and a second primary face opposite the first primary face, a conductive strip disposed on the first primary face of the first dielectric, a ground plane disposed on the second primary face of the first dielectric, and a first aperture extending through the ground plane, the first aperture having a first-aperture width, and a coaxial-line assembly extending along an axis transverse to the ground plane and having an end adjacent to the microstrip line, the coaxial-line assembly including an inner conductor extending along the axis into the first aperture and being electrically connected to the conductive strip, and an outer conductor extending along the axis to the ground plane, the outer conductor surrounding the inner conductor and having a cross section defining an enclosed area, the enclosed area having a width that is smaller than the first-aperture width, an end of the outer conductor being in contact with the ground plane.

As can be seen from the above description, a method of manufacturing a coaxial-to-microstrip transition between a coaxial-line assembly and a microstrip line, the coaxial-line assembly including an outer conductor spaced apart from and extending along a common axis with an inner conductor, and the microstrip line including a dielectric substrate, a conductive strip disposed along a first primary face of the dielectric substrate, and a ground plane disposed along a second primary face of the dielectric substrate opposite the first primary face, the dielectric substrate having a leading-edge face extending between the first and second primary faces, there being an unobstructed region next to the leading-edge face that is sized longer than a cross-sectional dimension of the inner conductor, the ground plane having an interface edge that is recessed along the second primary face from the leading-edge face, may include the steps of positioning the microstrip line relative to the coaxial-line assembly, with the ground plane extending transverse to the common axis and proximate the outer conductor, and moving the microstrip line toward the extension portion until the leading-edge face abuts the extension portion and the ground plane contacts the outer conductor.

INDUSTRIAL APPLICABILITY

The methods and apparatus described in the present disclosure are applicable to the telecommunications and other communication frequency signal processing industries involving the transmission of signals between circuits or circuit components.

It is believed that the disclosure set forth above encompasses multiple distinct inventions with independent utility. While each of these inventions has been disclosed in a particular form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein, and equivalents of them. Where the disclosure or subsequently filed claims recite "a" or "a first" element or the equivalent thereof, it is within the scope of the present inventions that such disclosure or claims may be understood to include incorporation of one or more such elements, neither requiring nor excluding two or more such elements.

Applicants reserve the right to submit claims directed to certain combinations and subcombinations that are directed to one of the disclosed inventions and are believed to be novel and non-obvious. Inventions embodied in other combinations and subcombinations of features, functions, elements and/or properties may be claimed through amendment of those claims or presentation of new claims in that or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. A coaxial-to-microstrip transition comprising:
a microstrip line including:
a first dielectric having a first primary face and a second primary face opposite the first primary face,
a conductive strip disposed on the first primary face of the first dielectric, and
a ground plane disposed on the second primary face of the first dielectric; and
a coaxial-line assembly extending along an axis transverse to the ground plane and having an end adjacent to the microstrip line, the coaxial-line assembly including:
an outer conductor extending along the axis to the ground plane, an end of the outer conductor being in contact with the ground plane, and
an inner conductor extending along the axis past the ground plane and being electrically connected to the conductive strip;
wherein the ground plane extends to a position between the outer conductor and the inner conductor on only a first side of the coaxial-line assembly proximate the conductive strip, and
wherein the microstrip line further includes a first aperture extending through the ground plane and through which the inner conductor extends, the aperture extending beyond the outer conductor on a second side of the coaxial-line assembly distal the conductive strip.

2. The coaxial-to-microstrip transition of claim 1, wherein the ground plane includes a curved edge proximate the inner conductor, the curved edge being convex relative to the inner conductor such that the ground plane curves away from the inner conductor.

3. The coaxial-to-microstrip transition of claim 1, wherein the first dielectric contacts the inner conductor on the first side of the coaxial-line assembly.

4. The coaxial-to-microstrip transition of claim 1, further comprising a second aperture extending through the first dielectric.

5. The coaxial-to-microstrip transition of claim 4, wherein the second aperture is plated with a conducting material connected to the ground plane to form a via.

6. The coaxial-to-microstrip transition of claim 4, wherein the ground plane is recessed from the second aperture on the first side of the coaxial-line assembly.

7. The coaxial-to-microstrip transition of claim 6, wherein the first dielectric contacts the inner conductor on the first side of the coaxial-line assembly.

8. A coaxial-to-microstrip transition comprising:
a microstrip line including:
a first dielectric having a first primary face and a second primary face opposite the first primary face,
a ground plane disposed on the second primary face of the first dielectric,
a conductive strip disposed on the first primary face of the first dielectric, and
a first aperture extending through the ground plane and having a non-circular cross section in a plane of the ground plane; and
a coaxial-line assembly extending along an axis transverse to the ground plane and being adjacent the microstrip line, the coaxial-line assembly including:
an outer conductor extending along the axis to the ground plane, the outer conductor being in contact with the ground plane, and
an inner conductor extending along the axis into the first aperture and being electrically connected to the conductive strip,
wherein the ground plane extends to a position between the outer conductor and the inner conductor on only a first side of the coaxial-line assembly proximate the conductive strip and wherein the first aperture extends beyond the outer conductor on a second side of the coaxial-line assembly distal the conductive strip.

9. The coaxial-to-microstrip transition of claim 8, wherein the first aperture has an oval, a rectangular, a square, or a diamond shaped cross-section.

10. The coaxial-to-microstrip transition of claim 9, wherein the inner conductor is asymmetrically disposed within the first aperture when viewed along the axis.

11. The coaxial-to-microstrip transition of claim 8, wherein the microstrip line includes a second aperture that extends through the first dielectric, the second aperture being in communication with the first aperture and being plated with a conducting material to form a via.

12. The coaxial-to-microstrip transition of claim 11, wherein at least one of the first and second apertures has an oval, a rectangular, a square, or a diamond shaped cross section.

13. The coaxial-to-microstrip transition of claim 12, wherein the inner conductor is asymmetrically disposed within both the first and second apertures when viewed along the axis.

14. A coaxial-to-microstrip transition comprising:
a microstrip line including:
a first dielectric having a first primary face and a second primary face opposite the first primary face,
a conductive strip disposed on the first primary face of the first dielectric,
a ground plane disposed on the second primary face of the first dielectric, and
a first aperture extending through the ground plane and having a cross section defining an aperture area; and
a coaxial-line assembly extending along an axis transverse to the ground plane and being adjacent the microstrip line, the coaxial-line assembly including:
an outer conductor in contact with the ground plane and having a cross section, in a plane parallel and proximate to the ground plane, defining an enclosed area, the ground plane overlapping a portion of the enclosed area on a first side of the coaxial-line assembly proximate the conductive strip and the first aperture extending beyond the outer conductor on a second side of the coaxial-line assembly opposite the first side, and an inner conductor extending along the axis into the first aperture and being electrically connected to the conductive strip.

15. The coaxial-to-microstrip transition of claim 14, wherein the ground plane includes a curved edge proximate the inner conductor, the curved edge being convex relative to the inner conductor such that the ground plane curves away from the inner conductor.

16. The coaxial-to-microstrip transition of claim 14, wherein the enclosed area is less than the aperture area.

17. The coaxial-to-microstrip transition of claim 14, further comprising a second aperture extending through the first dielectric, wherein the second aperture conforms to the first aperture.

18. A coaxial-to-microstrip transition comprising:

a microstrip line including:

a first dielectric having a first primary face and a second primary face opposite the first primary face, a conductive strip disposed on the first primary face of the first dielectric, a ground plane disposed on the second primary face of the first dielectric, and a first aperture extending through the ground plane, the first aperture having a first-aperture width; and a coaxial-line assembly extending along an axis transverse to the ground plane and having an end adjacent to the microstrip line, the coaxial-line assembly including:

an inner conductor extending along the axis into the first aperture and being electrically connected to the conductive strip, and an outer conductor extending along the axis to the ground plane, the outer conductor surrounding the inner conductor and having a cross section defining an enclosed area, the enclosed area having a width that is smaller than the first-aperture width, an end of the outer conductor being in contact with the ground plane, wherein the ground plane overlaps the enclosed area only on the first side of the coaxial-line assembly.

19. The coaxial-to-microstrip transition of claim 18, wherein the ground plane includes a curved edge proximate the inner conductor, the curved edge being convex relative to the inner conductor such that the ground plane curves away from the inner conductor.

20. The coaxial-to-microstrip transition of claim 18, further comprising a second aperture extending through the first dielectric, wherein the second aperture conforms to the first aperture.

21. The coaxial-to-microstrip transition of claim 18, wherein the first-aperture width is orthogonal to a strip plane defined by the axis and a line passing from the conductive strip to the inner conductor.

22. The coaxial-to-microstrip transition of claim 21, wherein the enclosed area width is orthogonal to the strip plane.

* * * * *